United States Patent [19]

McSparran

[11] 4,243,283

[45] Jan. 6, 1981

[54] CIRCUIT BOARD GUIDE AND GROUND CONNECTOR

[75] Inventor: Joseph F. McSparran, Cherry Hill, N.J.

[73] Assignee: RCA Corporation, New York, N.Y.

[21] Appl. No.: 76,141

[22] Filed: Sep. 17, 1979

[51] Int. Cl.[3] .............................. H05K 1/07

[52] U.S. Cl. .............................. 339/14 R; 339/45 M; 339/65; 339/74 R

[58] Field of Search .............. 339/14 R, 17 L, 17 M, 339/45 M, 65, 66 M, 74 R, 75 MP, 176 MP

[56] References Cited

U.S. PATENT DOCUMENTS 3,553,630 1/1971 Scheingold et al. .................. 339/74

3,576,515 4/1971 Frantz .............................. 339/74 R

*Primary Examiner*—Neil Abrams

*Attorney, Agent, or Firm*—Samuel Cohen; Carl V. Olson

[57] ABSTRACT

A low-impedance connection is made from a ground plane conductor plated on a printed circuit board to conductive channels mounted on a chassis to receive and guide the circuit board to a position where a connector plug on the circuit board engages a connector socket on the chassis. Insertion/extraction cams on the circuit board operate drawbars located within the channels to cause the channels to clamp down on the circuit board only when the board is in its fully-inserted position.

4 Claims, 11 Drawing Figures

CIRCUIT BOARD GUIDE AND GROUND CONNECTOR

This invention relates generally to electrical connectors, and particularly to electrical connectors by which printed circuit boards can be inserted into, and removed from, a chassis.

Complex electronic equipment is commonly constructed of a chassis having many channel guides to receive an equal number printed circuit boards, any one of which may be manually removed and replaced in case of a failure in the circuit on the circuit board. The end edge of a circuit board has a connector plug which makes electrical connections with a connector socket mounted on the chassis when the circuit board is inserted into place in the chassis. Since the plug and socket normally include a very large number of spring-biased wiping contacts, the printed circuit board is commonly provided with two manually-operated insertion/extraction cams or levers which cooperate with notches in the chassis to provide a mechanical advantage in engaging and disengaging the contacts.

The contacts of the connector plug on the circuit board and the connector socket on the chassis are such that they are not suitable for making as good a connection as desired between a ground plane on the circuit board and the chassis, especially for signals in the radio-frequency (RF) range. Attempts have been made to lower the impedance of the RF ground connection by printing ground conductors on the side edges of the circuit board for contact with the spring-loaded portions of the channels on the chassis which guide and support the circuit board. This solves the electrical RF impedance problem but the ground plane conductor plating printed on the edges of the circuit board is not robust enough to withstand repeated insertions and extractions of the board. The channel guides on the chassis tend to dig into and at least partially destroy the plating on the circuit board so that, in time, the necessary low-impedance RF ground connection is impaired. The damage is particularly great where the channel guides are made stiff so that the apparatus can withstand physical shock and vibration.

In accordance with an example of the invention, each channel guide on the chassis for receiving a side edge of a circuit board is provided with a number of internal longitudinally-spaced protrusions, and is provided with an internal drawbar having the same number of wedge-shaped portions or gibs for cooperation with respective protrusions, to normally provide a thick path in the channels for freely receiving a circuit board without damage to the ground plating thereon. The circuit boards are provided with insertion/extraction cams or levers which act on the drawbars when the circuit board is fully inserted to establish a good spring-loaded contact between the channel guides on the chassis and the ground plane platings on the side edges of the circuit board.

Figure 1:
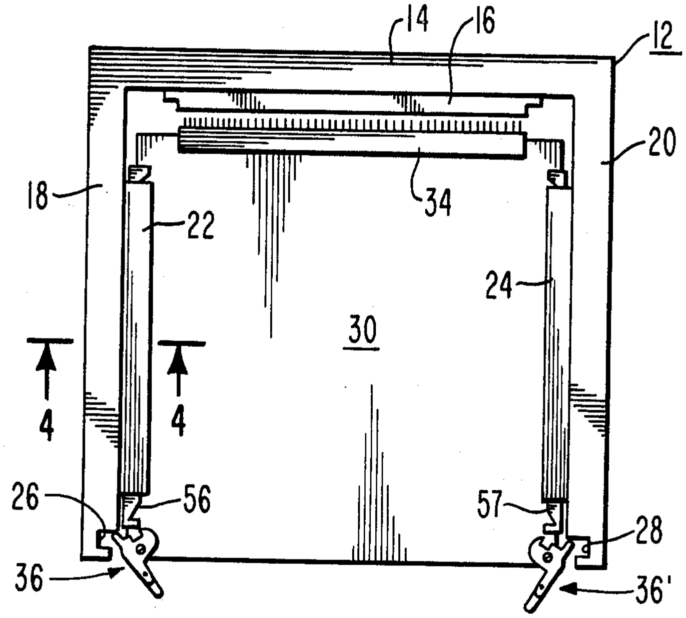
FIG. 1 is a plan view of a chassis and an almost-fully-inserted printed circuit board.

Referring now in greater detail to FIG. 1, there is shown a chassis 12 having a rear portion 14 which supports a multi-contact connector socket 16, and side portions 18 and 20 which support guiding channels 22 and 24, respectively. The front ends of chassis side portions 18 and 20 are provided with notches 26 and 28, respectively.

Figure 7:
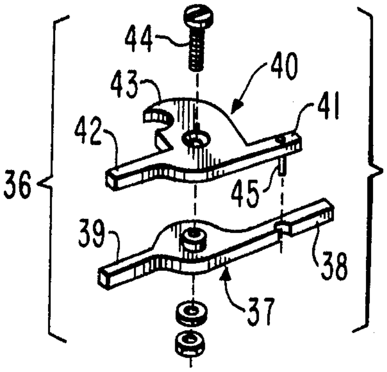
FIG. 7 is an exploded view of the insertion/extraction two-part cam or lever on the left side in FIGS. 1, 2 and 3.

A printed circuit board 30 has a leading edge carrying a multi-contact connector plug 34 for engagement with the connector socket 16 on the rear portion 14 of the chassis. The top and/or bottom surfaces of the circuit board 30 are provided with printed ground plane conductors 52' and 54' and circuit elements (not shown) which are connectable via connector plug 34 and connector socket 16 to circuits (not shown) on the chassis 12. The left front corner of the circuit board 30 supports a pivotally-mounted insertion/extraction two-part cam 36 shown in greater detail in FIG. 7. The cam includes a board-inserting member 37 having a handle 38 and a chassis-engaging protrusion 39; and includes a contact-clamping member 40 having a handle 41, a chassis-engaging protrusion 42 and a drawbar-engaging hook 43. The two portions 37 and 40 have a common pivot about a bolt 44 fastened to the circuit board 30. The right front corner of the circuit board is provided with a mirror-image two-part cam 36'.

Figure 4:
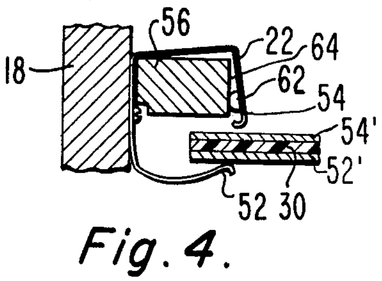
FIG. 4 is a cross sectional view taken on the line 4—4 of FIGS. 1 and 2.
Figure 6:
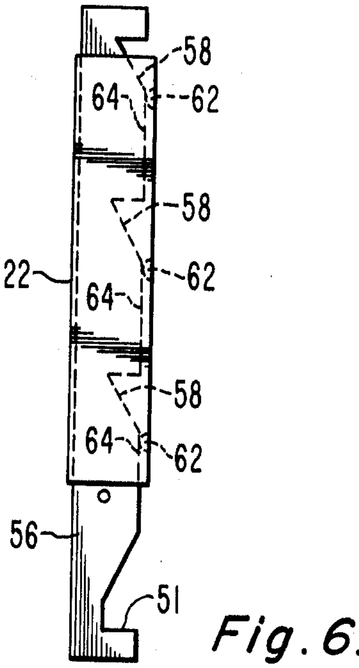
FIG. 6 is a plan view of the left-side channel guide and drawbar in the apparatus of FIGS. 1, 2 and 3.

The guiding channel 22 on the side portion 18 of the chassis is shown in cross section in FIG. 4 to be formed to receive the side edge of the printed circuit board 30 between a longitudinal lower contact 52 and a longitudinal upper contact 54. The guiding channel 22 is also formed to surround three sides of a drawbar 56, which is shown in FIG. 6 to be provided with three longitudinally-spaced inclined gibs or notches 58 for cooperation with three respective longitudinally-spaced protrusions 62 formed in the resilient channel 22. FIGS. 1, 2, 4 and 6 show the positions of the parts when the protrusions 62 are engaged by the high surfaces 64 of the drawbar to cause the portion of channel 22 including the contact edge 54 to be flexed outwardly and upwardly and away from the opposing contact edge 52. Thus, the contact edges 54 and 52 are maintained in a separated condition for the free passage of the circuit board 30 without pressure contact on the circuit board.

Figure 2:
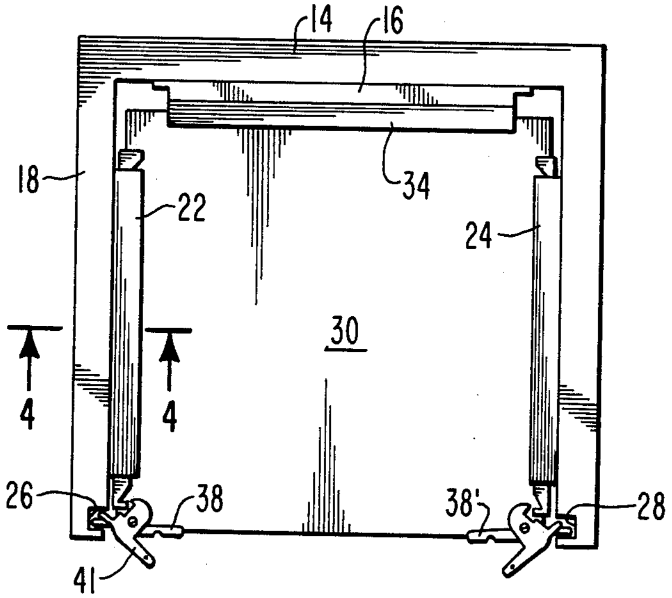
FIG. 2 is a plan view like that of FIG. 1 but with the circuit board in a fully-inserted position.

FIGS. 2 and 4 show the relationships of the parts when the circuit board 30 is fully inserted into the chassis as the result of a manual pushing of the handle 38 of the board-inserting member 37 toward the chassis. This caused the protrusion 39 to engage the notch 26 in the chassis and force the board into position in the chassis. The same action is simultaneously accomplished by acting on handle 38' at the right side of the board 30.

Figure 5:
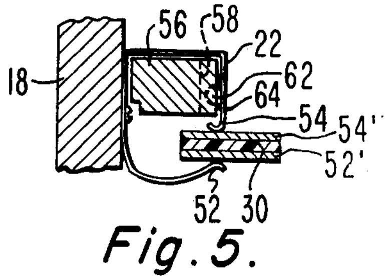
FIG. 5 is a cross sectional view taken on the line 5—5 of FIG. 3.
Figure 3:
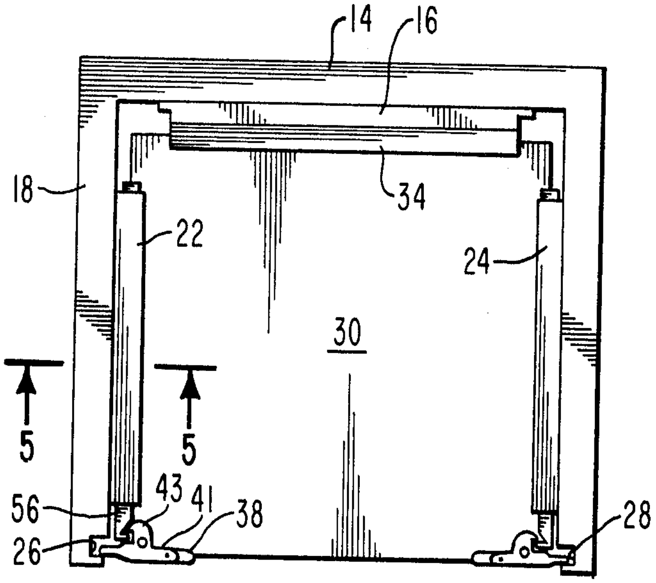
FIG. 3 is a plan view like that of FIG. 2 but with the circuit board in a contact-clamping position.

FIG. 3 shows the final contact-clamping position of the board 30 in which the handle 41 of the contact-clamping member 40 has been urged toward the chassis to cause the hook 43 to pull the drawbar 56 forward. This allows the guide 22 to spring into the position shown in FIG. 5 where the rolled edge contact 54 of the guide firmly engages the printed ground plane conductor 54′ on the top surface of the board 30. What has been said about the parts on the left side of the chassis applies equally to the matching parts on the right side of the chassis.

In operation, the drawbars are initially in the positions illustrated by FIGS. 4 and 6. A circuit board 30 is then freely admitted into the chassis to the position shown in FIG. 1. The lever handle 38, 38′ of insertion-/extraction cam members 37, 37′ are then pressed inwardly causing the extensions 39, 39′ to engage notches 26 and 28 and force the circuit board into the fully-inserted position shown in FIG. 2. Next, the lever handles 41, 41′ of the cam members 40, 40′ are pressed inwardly causing the claws 43, 43′ to engage the notches 51, 51′ in the drawbars 56, 57. The drawbars are thus drawn forward to the positions shown in FIGS. 3 and 5 in which the inclined notches 58 in the drawbars are opposite the dimples 62 in the resilient outer walls of the channels 22, 24. This permits the contacts 52 and 54 (FIG. 5) of the channels to clamp onto, and make good contact with, ground plane conductors 52′ and 54′ printed on the side edges of the circuit board. The contact is made after the circuit board 30 has been forced to its fully-inserted position, so there is no damage by the channel contacts to the ground plane conductors printed on the circuit board.

When it is desired to remove a fully-inserted circuit board, the lever handles 38, 38′ of cam members 37, 37′ are pulled outwardly from the positions shown in FIG. 3. Because of the coupling pins 45, 45′ in the handles 41, 41′, both the cam members 37 and 40 are simultaneously returned to the positions shown in FIG. 1. The simultaneously-operated cam members cause the drawbars to be pushed inwardly to release pressure between channel contacts 52, 55 and the circuit board, and the circuit board connector 34 on the board to be separated from the mating socket 16 on the chassis. The circuit board can then be fully removed from channel guides without effort and without damage to the conductors 52′ and 54′ printed on the circuit board.

The coupling of members 37, 37′ with members 40, 41′ by means of pins 45, 45′ insures that the cam members 40, 40′ are in the right position during insertion of the circuit board because the lever handles of the cam members 37, 37′ must be in the fully outward position to clear the notches 26 and 28 in the chassis.

Figure 8:
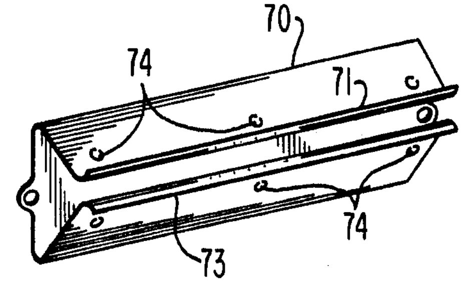
FIG. 8 is a perspective view of an alternative channel guide for receiving a circuit board.
Figure 9:
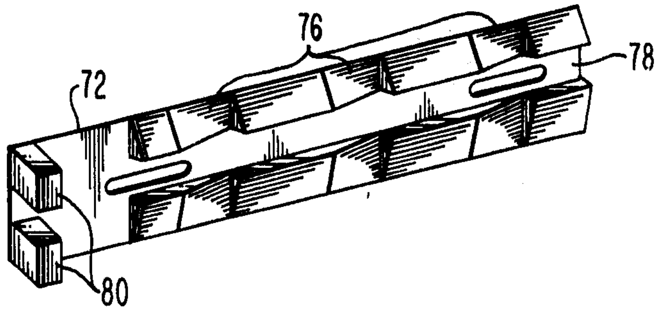
FIG. 9 is a perspective view of a drawbar for use in the channel guide of FIG. 8.
Figure 10:
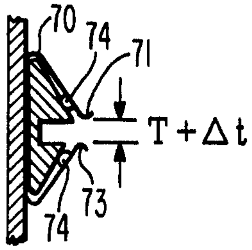
FIG. 10 is a cross sectional view of a channel with drawbar, according to FIGS. 8 and 9, when in the circuit-board-receiving position.
Figure 11:
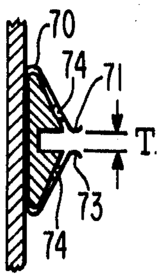
FIG. 11 is a cross sectional view like FIG. 10 when the circuit board is in the fully-inserted position.

FIGS. 8 through 11 show an alternative construction wherein each channel guide 70 as shown in FIG. 8 has longitudinal contacting edges 71 and 73. Each channel guide encloses a volume of triangular cross section to receive a drawbar 72 as shown in FIG. 9. The channel 70 is provided with spaced protrusions 74 which cooperate with surfaces on the drawbar 72 which are provided with an equal number of gibs or inclined surfaces 76. The drawbar 72 is also provided with a longitudinal groove 78 to receive the edge of a circuit board, and with blocks 80 to be acted on by the claw of an insertion/extraction cam as described in connection with FIGS. 1, 2 and 3. FIG. 10 is a cross sectional view showing the drawbar 70 in a position where the channel protrusions 74 hold channel contacts 71 and 73 in a spaced relation dimensioned $T+\Delta t$ to permit frictionless passage of the edge of a circuit board. FIG. 11 is a cross sectional view showing the drawbar 70 in a position where the channel protrusions 74 extend into recesses in the drawbar so that the spring-biased contacts 71 and 73 of the channel close together to the thickness dimension T of the circuit board and firmly engaging the ground plane conductors printed on a circuit board positioned therebetween. It is seen that the principle of operation of the "triangular" channels and guides of FIGS. 7–10 is similar to that of the "rectangular" channels and guides of FIGS. 1–7.

What is claimed is:

1. The combination of:

a printed circuit board having an electrical connector plug on one end edge of the board, and having a printed circuit ground plane conductor on at least one surface on at least one side edge of the board, a chassis supporting an electrical connector socket, and supporting channels to guide the side edges of the board so that the plug engages the socket, at least one of said channels being resilient, conductive and provided with internal protrusions spaced along the length of the channel, a drawbar within said resilient conductive channel and having gibs for engagement with said protrusions to normally hold the conductive channel out of electrical contact with said ground plane conductor on the board, means to move the plug on the board into engagement with the socket on the chassis, and means to move the drawbar longitudinally to disengage the gibs from the protrusions to thereby allow the resilient conductive channel to move into electrical contact with the ground plane conductor on the board.

2. The combination of claim 1 wherein said means to move the plug into engagement with the chassis socket comprises a manually-rotated lever on the board which engage a notch on the chassis.

3. The combination of claim 2 wherein said means to move the drawbar comprises a second manually-rotated lever on the board which engages a notch in the drawbar.

4. The combination of claim 3 wherein said levers are mounted with a common pivot on the board.

* * * * *